US007064619B1

(12) United States Patent
Meyer et al.

(10) Patent No.: US 7,064,619 B1
(45) Date of Patent: Jun. 20, 2006

(54) METHOD AND APPARATUS FOR RESTARTING A GPS-BASED TIMING SYSTEM WITHOUT A GPS SIGNAL

(75) Inventors: Charles John Meyer, Wayne, NJ (US); Donald A. Palaski, Stroudsburg, PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 11/142,086

(22) Filed: May 31, 2005

(51) Int. Cl.
*G01R 23/00* (2006.01)

(52) U.S. Cl. ........................................................ 331/44

(58) Field of Classification Search .................. 331/44, 331/74, 177 R
See application file for complete search history.

(56) References Cited

U.S. PATENT DOCUMENTS 4,899,117 A * 2/1990 Vig ............................... 331/3
D364,621 S 11/1995 Clarke et al.
5,655,018 A 8/1997 Estevez et al.
6,049,315 A 4/2000 Meyer
6,104,287 A 8/2000 Meyer

* cited by examiner

*Primary Examiner*—David Mis

(57) ABSTRACT

A method and apparatus for restarting a GPS-based timing system without a GPS signal is provided. More specifically, there is provided a system comprising an antenna, a GPS receiver coupled to the antenna and configured to generate a GPS traceable timing signal based on a GPS transmission, and a timing system coupled to the GPS receiver, the timing system comprising a holdover oscillator, timing circuitry coupled to the holdover oscillator and configured to receive the GPS traceable timing signal and to calculate a correction factor for the holdover oscillator, and a non-volatile memory coupled to the timing circuitry, wherein the timing circuitry is configured to store the correction factor on the non-volatile memory.

20 Claims, 3 Drawing Sheets

METHOD AND APPARATUS FOR RESTARTING A GPS-BASED TIMING SYSTEM WITHOUT A GPS SIGNAL

BACKGROUND OF THE INVENTION

1. Field of the Invention

The present invention relates generally to timing systems and more particularly to timing and synchronization systems based on global positioning system timing signals.

2. Description of the Related Art

This section is intended to introduce the reader to various aspects of art that may be related to various aspects of the present invention, which are described and claimed below. This discussion is believed to be helpful in providing the reader with background information to facilitate a better understanding of the various aspects of the present invention. Accordingly, it should be understood that these statements are to be read in this light, and not as admissions of prior art.

Many modern technologies rely on extremely precise timing and synchronization. One example of such a technology is the modern cellular telephone system. As most people are aware, cellular telephones and other wireless devices communicate with cellular towers or base stations that are connected to the conventional land-based telephone system or the Internet. Individually, each of these towers only provides coverage for a relatively small area or "cell." However, by working together, a plurality of towers can create a grid or network of coverage that can encompass an entire city, state, or region. This network of towers is transparent to the end user, because the cellular towers are configured to "hand off" calls from one tower to another tower as the user moves from place to place. For example, if person has a conversation on a mobile telephone while driving to work, this single conservation may actually include a multitude (i.e., five, ten, or more) individual transmissions with different cellular towers along the route. Each of these towers communicates with the wireless telephone while the wireless telephone is in range of that tower and then hands off the call to another tower when the telephone moves out of range. Because the towers are precisely synchronized with each other, the hand off is usually completely transparent to the telephone user. In this way, synchronization enables the "on-the-go" conservations that most people now take for granted.

Precise timing and synchronization is also advantageous in modern power generation and transmission. Electrical power is typically transmitted in the form of three-phase power, which has three separate alternating current ("ac") power signals that overlap with each other but are out of phase. This three-phase power may be generated by a variety of power plants or sources disposed across an electrical grid. If power generated by one of the power plants is out of synchronization with the power generated by another one of the power plants, the out-of-sync power signals can interfere with each other and reduce the available power. For this reason, modern power generation and transmission facilities typically synchronize three-phase power across the power grid.

One of the fundamental challenges in synchronization is the oscillators that underlie the majority of modern timing systems and clocks. Most modern timing systems employ some form of material, such as quartz crystal or rubidium, in the circuitry used to generate a waveform with a predictable frequency. However, even with the most precise and complex oscillators, there are slight variations in the frequency of the oscillation from one oscillator to another. Over time these slight variations can cause even the most precise oscillator-based clocks or timing systems to become out-of-sync with one another.

One solution for this problem is the atomic clock. Atomic clocks are precision clocks that include an oscillator that is regulated by the natural vibration frequencies of an atomic system, such as the resonance frequency of cesium atoms. Because the resonance frequency of cesium atoms is deterministic and constant, once synchronized, two atomic clocks will maintain virtually the same time (to within a nanosecond or less) for an extremely long period of time. Unfortunately, atomic clocks tend to be fairly expensive, and it is thus not practical to build an atomic clock into every application that could benefit from precise timing and synchronization.

Advantageously, the Global Positioning System ("GPS") provides a mechanism to distribute precise, atomic clock-based timing data worldwide with only a relatively small number of atomic clocks. As most people are aware, GPS is a satellite-based navigation system that has at least 24 satellites orbiting the earth. These satellites were originally intended for military applications, but have some signals that have been subsequently made available for civilian use. Each GPS satellite contains a highly accurate atomic clock that is synchronized with the atomic clocks on each of the other GPS satellites. Each GPS satellite continually transmits a radio wave signal that includes the current time. A GPS receiver on the surface or in the air can receive this signal and, by comparing the time the signal was transmitted with the time that the GPS receiver received the signal, compute a distance from the GPS receiver to the satellite. By determining the distance between the GPS receiver and at least four satellites, the GPS receiver can triangulate its location.

As described above, GPS receivers determine their distance from GPS satellites by measuring the amount of time that it takes for the signal to be transmitted from the satellite to the GPS receiver. However, because radio waves travel at the speed of light, it may take only nanoseconds ($10^{-9}$ seconds) for the signal to be transmitted from the satellite to the GPS receiver. As such, in order for the receiver to determine the transmission time accurately, the GPS receiver synchronizes itself to the atomic clocks on the GPS satellites with a degree of accuracy in the nanosecond range. This synchronization is maintained by periodically resynchronizing the GPS receiver with the atomic clock on the GPS satellite.

As described above, the GPS satellites encircle the Earth, and each of the satellites broadcasts a clock signal that is accurate to the nanosecond range. As such, in addition to providing a worldwide location system, the GPS system also provides a highly precise and accurate worldwide clock. For this reason, many of the applications discussed above that depend on precise synchronization use the GPS timing signals for synchronization.

As the number of applications that rely on GPS time for synchronization increases, many people have become concerned about the ramifications if the GPS system were to fail or be shut down. These concerns are especially important in the post-9/11 world, because the United States government has explicitly warned that the civilian GPS system could be turned off in the event of a terrorist act. As such, most GPS based timing devices also include a holdover oscillator that operates in parallel to the GPS system. These holdover oscillators, however, are not as accurate as the atomic clocks on the GPS satellites and, thus, are periodically "tuned" so that the frequency of the holdover oscillator matches the frequency of the atomic resonance of the atomic clocks in the GPS satellites.

Depending on its quality, the holdover oscillator may permit a GPS-based timing system to continue to produce an accurate time for several seconds, minutes, or days, in the absence of a GPS timing signal. The holdover oscillators, however, are dependent on electrical power, and, in the event of a loss of power, the holdover oscillator's "tuning" information can be lost. As such, after a restart, the frequency of the holdover oscillator may not match=the frequency of the atomic resonance in the atomic clocks. If the GPS system is operating normally, the holdover oscillator can immediately be retuned with the GPS timing signal after a restart. However, if the GPS timing signal is not available due to a GPS failure or denial of service, it may not be possible to retune the holdover oscillator to the correct frequency. Without a tuned holdover oscillator, it may be difficult or impossible to restart the application or system that relies on precise synchronization.

A system that can facilitate a restart of a GPS-based timing system in the absence of the GPS timing signal would be advantageous.

SUMMARY OF THE INVENTION

Certain aspects commensurate in scope with the disclosed embodiments are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In one embodiment, there is provided a system comprising an antenna, a GPS receiver coupled to the antenna and configured to generate a GPS traceable timing signal based on a GPS transmission, and a timing system coupled to the GPS receiver, the timing system comprising a holdover oscillator, timing circuitry coupled to the holdover oscillator and configured to receive the GPS traceable timing signal and to calculate a correction factor for the holdover oscillator, and a non-volatile memory coupled to the timing circuitry, wherein the timing circuitry is configured to store the correction factor on the non-volatile memory.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions should be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The embodiments described below are directed towards a system or a method for restarting a GPS based timing system without a GPS signal. Specifically, in one embodiment, a timing system may periodically store "tuning" data generated based on a GPS traceable timing signal in a non-volatile memory. This tuning data can then be employed to tune a holdover oscillator within the timing system and facilitate the restart of the timing system without a GPS traceable timing signal.

Figure 1:
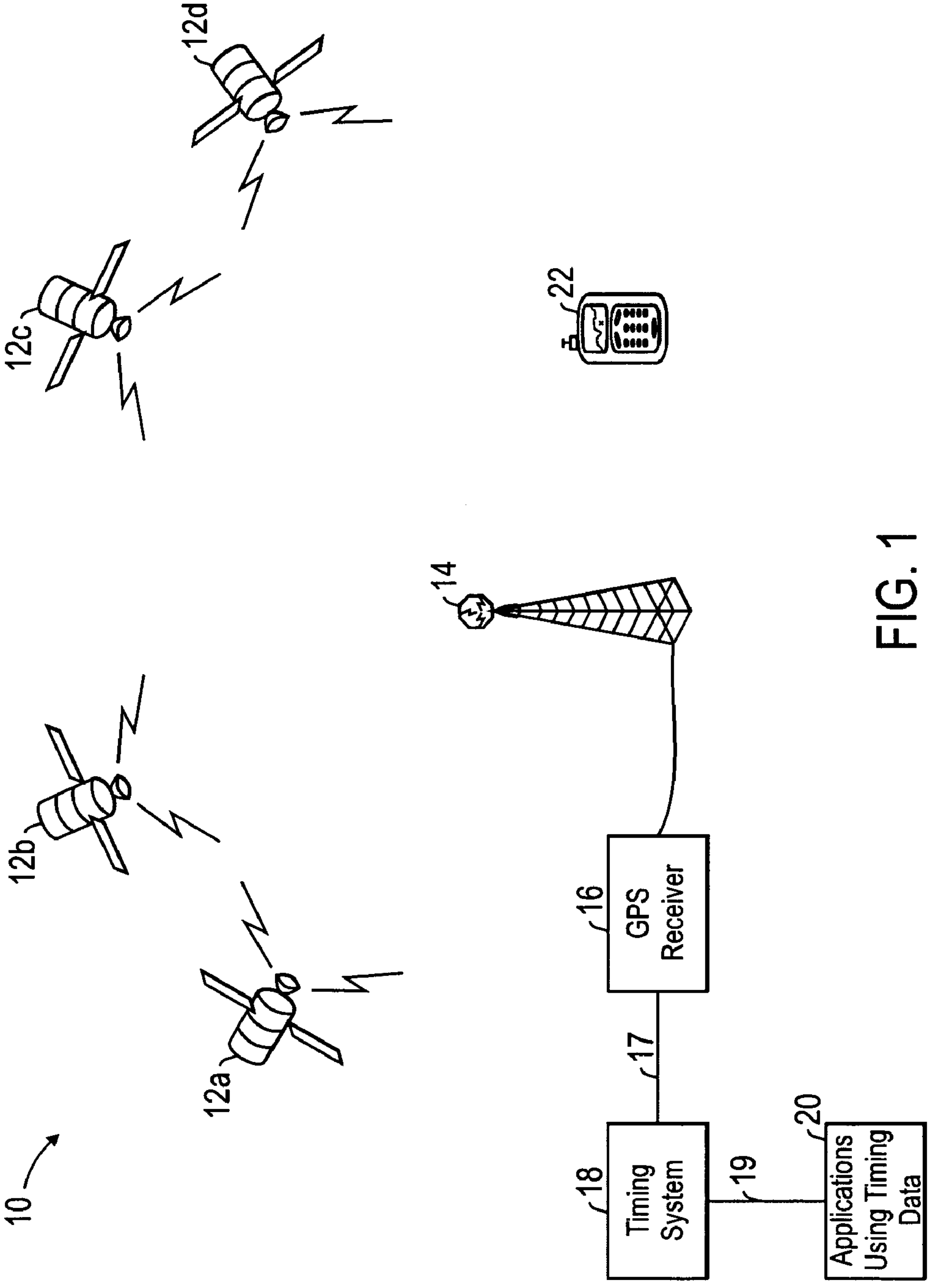
FIG. 1 illustrates an exemplary GPS-based system in accordance with an exemplary embodiment of the present invention.

Turning now to FIG. 1, an exemplary GPS-based system in accordance with an exemplary embodiment is illustrated and generally designated by a reference numeral 10. The system 10 includes a plurality of GPS satellites 12*a*, 12*b*, 12*c*, and 12*d* encircling the earth in low earth orbit. The satellites 12*a*–12*d* are configured to broadcast precise GPS timing signals based at least partially on atomic clocks located within the satellites 12*a*–12*d*.

The system 10 also includes a GPS antenna 14, which is configured to receive signals from the satellite 12*a*–12*d* and transmit the received signals to a GPS receiver 16. In one embodiment, the GPS antenna 14 may be integrated into or mounted on a wireless telephone base station. The GPS receiver 16 decodes each of the signals transmitted from the satellites 12*a*–12*d* and transmits a precise GPS traceable timing signal 17 (i.e., a precise timing signal that is derived from the GPS signal) to a timing system 18. Those of ordinary skill in the art will appreciate that the GPS traceable timing signal 17 may be accurate to 100 nanoseconds or less of the time on the atomic clocks located on the satellites 12*a*–12*d*. The timing system 18, which will be described in greater detail with regard to FIGS. 2 and 3, may use the GPS traceable timing signal 17 to generate an accurate timing signal 19. The GPS traceable timing signal 17 may also be employed to synchronize an internal holdover oscillator within the timing system 18 (see FIG. 2) to the atomic clocks on the satellites 12*a*–12*d*. This holdover oscillator can then generate the timing signal 19 in the absence of the GPS traceable timing signal 17. In one embodiment, the GPS receiver 16 and/or the timing system 18 may be integrated into a wireless telephone base station, radio network controller, or other suitable telecommunication equipment.

The timing system 18 may transmit the accurate timing signal 19 to a variety of applications 20 that employ the timing data. In one embodiment, the application 20 is a communication system, such as a wireless telephone base station or internet service provider. In another embodiment, the application 20 is a control center for a power grid. Those of ordinary skill in the art will appreciate that these examples are merely exemplary and are not intended to be exclusive.

The system 10 may also include a portable GPS device 22. The portable device 22 may include one or more of the antenna 14, the GPS receiver 16, and the timing system 16 disposed in a portable chassis or case (not shown). In one embodiment, the portable device 22 is a GPS-enabled cellular telephone. In another embodiment, the portable device 22 is a personal digital assistant ("PDA") or other portable computing device configured to aid in navigation.

Figure 2:
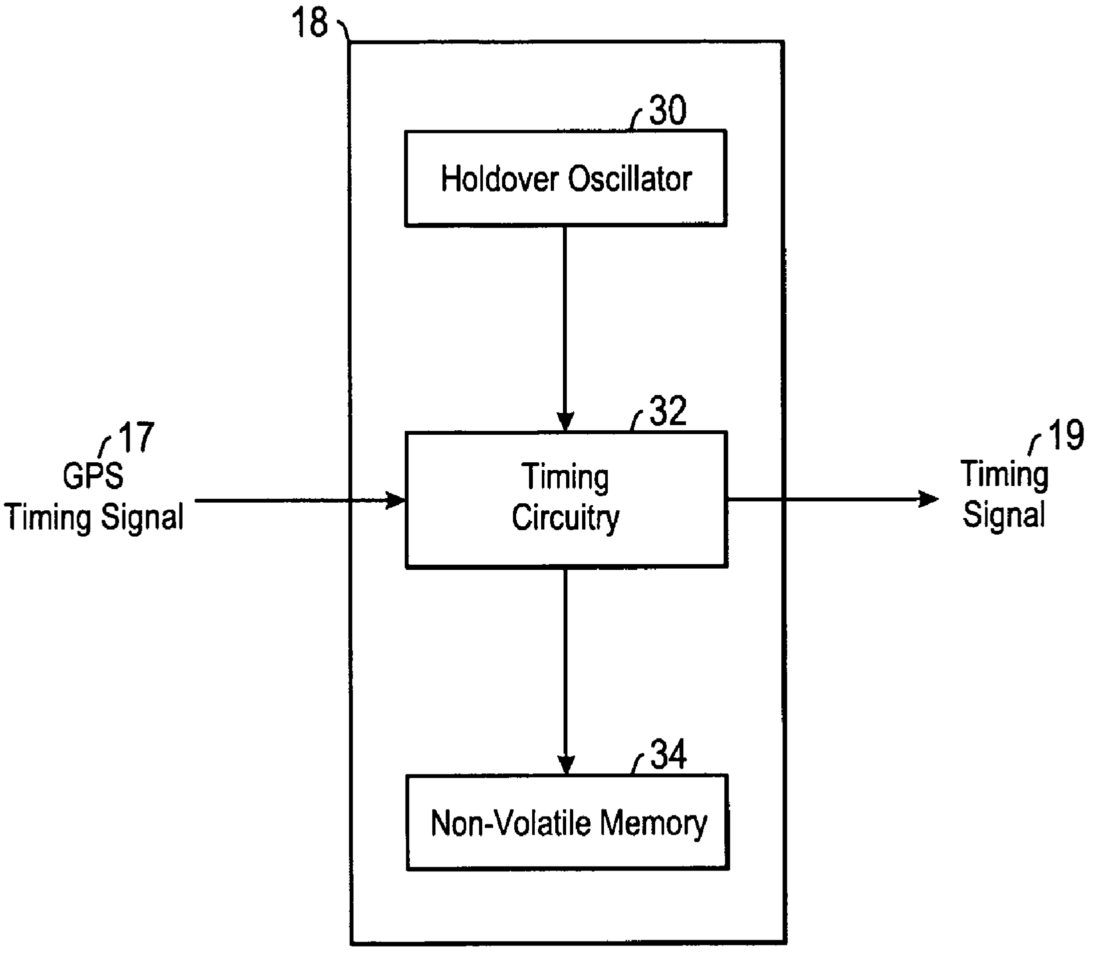
FIG. 2 illustrates a an exemplary timing system in accordance with an embodiment of the present invention.

As described above, the system 10 may include a timing system 18, an exemplary embodiment of which is illustrated in FIG. 2. As illustrated, the timing system 18 includes a holdover oscillator 30, timing circuitry 32, and a non-volatile memory 34. The holdover oscillator 30 may be configured to provide temporary holdover or fly-wheeling of the GPS traceable timing signal 17 should the GPS signal be interrupted. Specifically, the timing circuitry 32 may use the GPS traceable timing signal 17 to synchronize the frequency of the oscillation of the holdover oscillator 30 to the frequency of the oscillations of the atomic clocks located on the satellites 12*a*–12*d*. In one embodiment, the frequency of the holdover oscillator 30 is synchronized to a degree of accuracy of 0.001 hertz of the frequency of the atomic clocks. In alternate embodiments, other suitable degrees of accuracy may be employed by the timing system 18. The holdover oscillator 30 may be any suitable type, such as crystal, Rubidium, etc. For example, in one embodiment, the holdover oscillator 30 is a Rubidium (Rb) oscillator. In still other embodiments, the holdover oscillator 30 is an oven-controlled quartz crystal oscillator, a quartz crystal oscillator, a temperature controlled oscillator, a voltage controller oscillator, and so forth.

In operation, the timing circuitry 32 may compare the GPS traceable timing signal 17 to the frequency of the holdover oscillator 30. From this comparison, the timing circuitry 32 may generate a frequency correction for the holdover oscillator 30. By periodically generating a frequency correction for the holdover oscillator 30, it is possible to ensure that the frequency of the holdover oscillator 30 matches the frequency of the atomic clocks in the GPS satellites 12*a*–12*d* to within a desired degree of accuracy. Depending on its quality, the holdover oscillator 30 may be able to maintain this accurate synchronized frequency for seconds, hours, days, or longer without additional frequency corrections.

As illustrated, the timing system 18 may also include the non-volatile memory 34 to store the latest correction or the latest series of correction factors. The non-volatile memory 34 may include any suitable form of static or non-volatile memory. For example, the non-volatile memory 34 may include read only memory (ROM), programmable read only memory (PROM), erasable programmable read only memory (EPROM), electrically erasable programmable read only memory (EEPROM), flash memory, or random access memory (RAM) that is powered with a battery. In one embodiment, the timing circuitry 32 is configured to store the latest correction factor, which is also referred to as a "snapshot," for the holdover oscillator 30 in the non-volatile memory 34. As will be described further below with regard to FIG. 3, by storing the correction factor for the holdover oscillator 30 in the non-volatile memory 34, the timing circuitry 32 is able to produce a precise timing signal 19 after a restart even in the absence of the GPS traceable timing signal 17. In alternate embodiments, the timing circuitry 32 is configured to store a "trend" of recent correction factors or to store a cumulative average of a plurality of recent correction factors instead of a single snapshot. In these alternate embodiments, the timing circuitry 32 uses either the correction factor trend or the average correction factor to tune the holdover oscillator 30, as described below in regard to FIG. 3.

Figure 3:
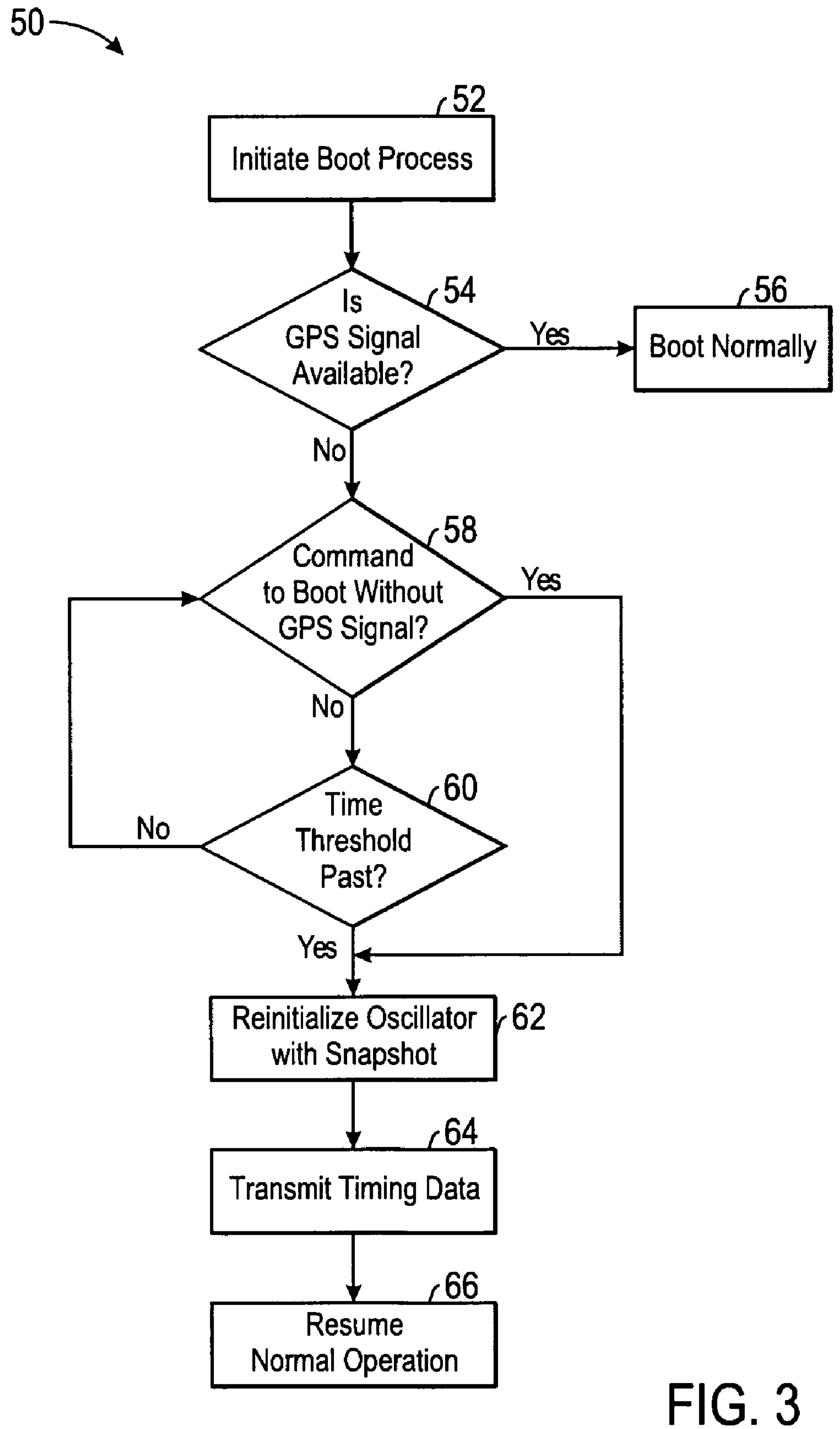
FIG. 3 illustrates a flow chart illustrating an exemplary technique for restarting a GPS based timing system without a GPS signal.

As described above, the timing circuitry 32 may be configured to store a correction factor in the non-volatile memory 34. As described below with regard to FIG. 3, the timing circuitry 32 may use the correction factor to restart the timing system 18 without a GPS signal. FIG. 3 is a flowchart illustrating an exemplary technique 50 for restarting a GPS-based timing system without a GPS signal. As indicated in block 52, the timing circuitry 32 begins by initiating a boot or restart process for the timing system 18. One of the first steps in the timing system's boot process is to determine if the GPS traceable timing signal 17 is available, as indicated in block 54. If the GPS traceable timing signal 17 is available, the timing system 18 will boot normally, as indicated in block 56. If, however, the GPS traceable timing signal 17 is not available, the timing system 18 will determine whether a command or instruction has been received to boot the timing system 18 without the GPS traceable timing signal 17, as illustrated by block 58. This command or instruction may be provided by a user via a human interface or may be generated automatically by a software or hardware subroutine running within the timing system 18 or elsewhere in the system 10. If the timing system 18 has received a command to boot without the GPS traceable timing signal 17, the technique 50 will proceed to block 62, which is described below.

Even if the timing system 18 has not received a command to boot without the GPS traceable timing signal 17, the timing system 18 may also be configured to restart automatically without the GPS traceable timing signal 17 after the passage of a predetermined amount of time. For this reason, the timing system 18 may next determine whether the predetermined time threshold has elapsed (if applicable), as indicated in block 60. If the predetermined time threshold has not yet elapsed, the timing system 18 may stop the boot process and await either a command to a boot without the GPS signal 17 or the passage of the predetermined threshold time (if applicable).

Once the timing system 18 decides to boot without the GPS traceable timing signal 17, the timing circuitry 32 within the timing system 18 will use the snapshot or other timing information stored in the non-volatile memory 34 to tune the holdover oscillator 30. One of ordinary skill in the art will appreciate that by employing the snapshot stored in the non-volatile memory 34, the timing circuitry 32 is applying a "last-known-good" correction factor to the holdover oscillator 30. In an alternate embodiment, the timing circuitry may use the trend of recent correction factors or the average of a plurality of recent correction factors to tune the holdover oscillator 30.

Once the holdover oscillator 30 has been tuned, the timing circuitry 32 may resume transmission of the timing signal 19, as indicated by block 64 and the application 20 may resume normal operation, as indicted by block 66. Those of ordinary skill in the art will appreciate that even though the non-volatile memory 34 is not a permanent replacement for the GPS traceable timing signal 17, the timing system 18, as described above, may enable the restart of applications in the absence of the GPS signal 20 that otherwise could not be restarted. In this way, the timing system 18 may enable the successful operation of critical communication and power generation infrastructure during times when these services might otherwise be limited or unavailable.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

We claim:

1. A method comprising:

calculating a correction factor for an oscillator based on a GPS traceable timing signal; and storing the correction factor in a non-volatile memory.

2. The method, as set forth in claim 1, comprising determining if a GPS traceable timing signal is available.

3. The method, as set forth in claim 2, comprising tuning the frequency of the oscillator using the correction factor stored in the non-volatile memory if the GPS traceable timing signal is not available.

4. The method, as set forth in claim 3, wherein tuning the frequency comprises tuning the frequency of the oscillator in response to restarting a system without a GPS traceable timing signal.

5. The method, as set forth in claim 3, comprising generating a timing signal with the tuned oscillator.

6. The method, as set forth in claim 5, comprising synchronizing an application using the timing signal generated by the tuned oscillator.

7. The method, as set forth in claim 1, wherein calculating a correction factor comprises calculating a correction factor based on a trend of previous correction factors.

8. The method, as set forth in claim 1, wherein calculating a correction factor comprises calculating a correction factor based on an average of plurality of recent correction factors.

9. A system comprising:

an antenna;

a GPS receiver coupled to the antenna and configured to generate a GPS traceable timing signal based on a GPS transmission; and a timing system coupled to the GPS receiver, the timing system comprising:

a holdover oscillator;

timing circuitry coupled to the holdover oscillator and configured to receive the GPS traceable timing signal and to calculate a correction factor for the holdover oscillator; and a non-volatile memory coupled to the timing circuitry, wherein the timing circuitry is configured to store the correction factor on the non-volatile memory.

10. The system, as set forth in claim 9, wherein the timing circuitry is configured to tune the frequency of the holdover oscillator based on the correction factor stored in the non-volatile memory.

11. The system, as set forth in claim 10, wherein the timing circuitry is configured to generate a timing signal based on the tuned frequency of the holdover oscillator.

12. The system, as set forth in claim 11, comprising an application configured to employ the timing signal.

13. The system, as set forth in claim 12, wherein the application comprises a wireless base station.

14. The system, as set forth in claim 13, wherein the wireless base station comprises the timing system.

15. The system, as set forth in claim 13, wherein the application comprises an electrical power distribution system.

16. The system, as set forth in claim 9, wherein the non-volatile memory comprises flash memory.

17. The system, as set forth in claim 9, wherein the non-volatile memory comprises random access memory coupled to a battery.

18. A tangible machine readable medium comprising:

code adapted to calculate a correction factor for an oscillator based on a GPS traceable timing signal; and code adapted to store the correction factor in a non-volatile memory.

19. The tangible medium, as set forth in claim 18, comprising code adapted to determine if a GPS traceable timing signal is available.

20. The tangible medium, as set forth in claim 18, wherein the non-volatile memory comprises flash memory.

* * * * *